United States Patent [19]

Varney, Jr.

[11] Patent Number: 5,115,190

[45] Date of Patent: May 19, 1992

[54] FREEZING ITEMS FOR DISPLAY IN ELECTRONIC WATTHOUR REGISTER

[75] Inventor: Albert R. Varney, Jr., Rochester, N.H.

[73] Assignee: General Electric Company, Somersworth, N.H.

[21] Appl. No.: 751,652

[22] Filed: Aug. 22, 1991

Related U.S. Application Data

[63] Continuation of Ser. No. 512,799, Apr. 27, 1990, abandoned, which is a continuation of Ser. No. 22,145, Mar. 5, 1987, abandoned.

[51] Int. Cl.⁵ .................... G01R 11/32; G01R 13/02
[52] U.S. Cl. ................................ 324/142; 324/103 R; 364/483
[58] Field of Search ................... 324/142, 103 R, 116; 364/483; 340/870.02, 637, 798, 799

[56] References Cited

U.S. PATENT DOCUMENTS 4,283,772  8/1981  Johnston ................... 324/103 R X
4,355,361  10/1982  Riggs et al. ................ 324/103 R X Primary Examiner—Stephen M. Baker
Attorney, Agent, or Firm—Robert E. Brunson; Thomas R. Morrison

[57] ABSTRACT

An electronic register for an electric watthour metering system includes a display buffer for receiving, at substantially the same time, all data items to be displayed. The data items in the display buffer are scrolled to a display in sets appropriate for the capacity of the display. Each set is maintained on the display for as long as required for human reading. The displayed items, having been taken into the display buffer at the same instant, are consistent with each other regardless of the length of time required to complete the display sequence.

9 Claims, 2 Drawing Sheets

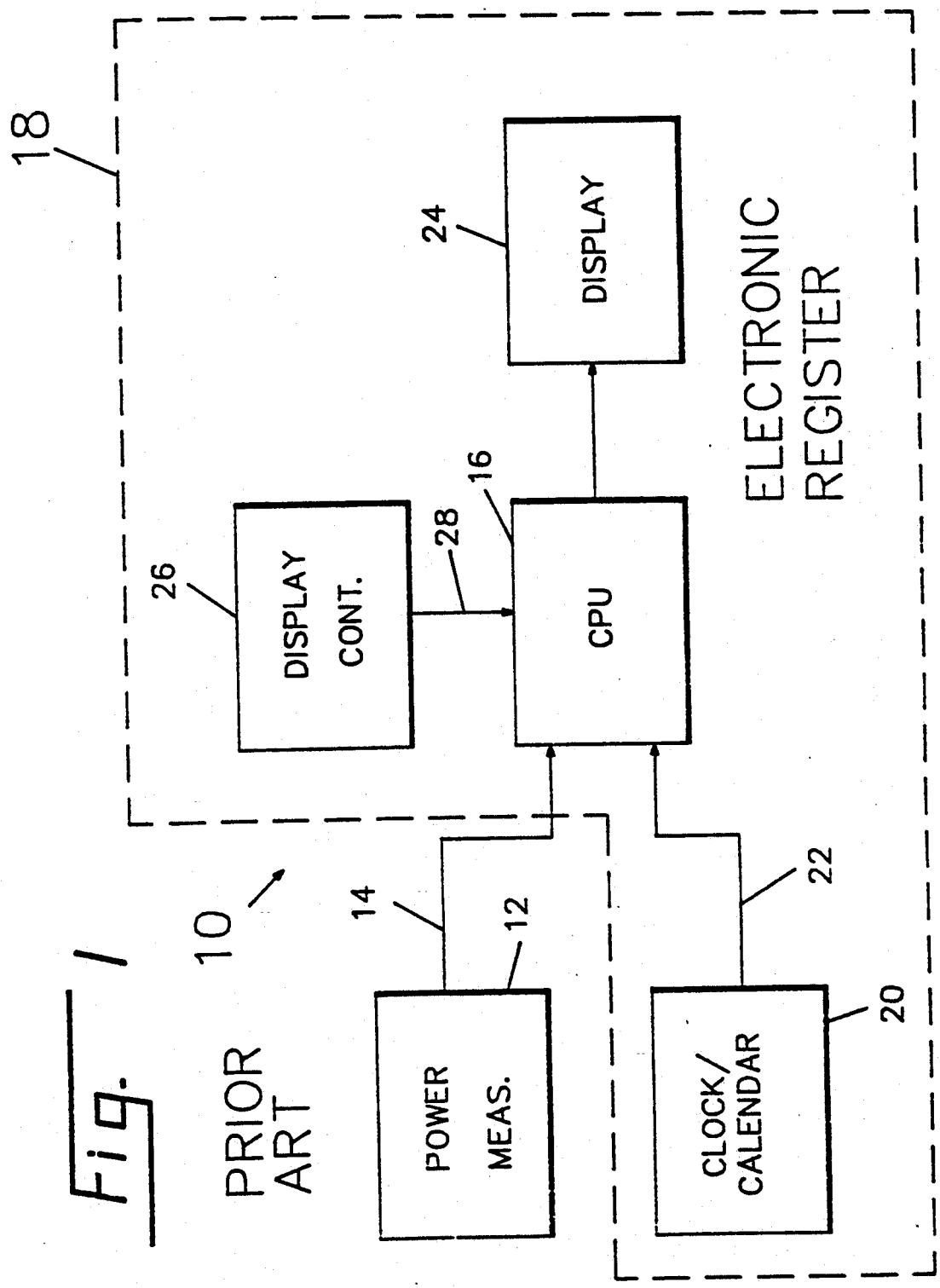

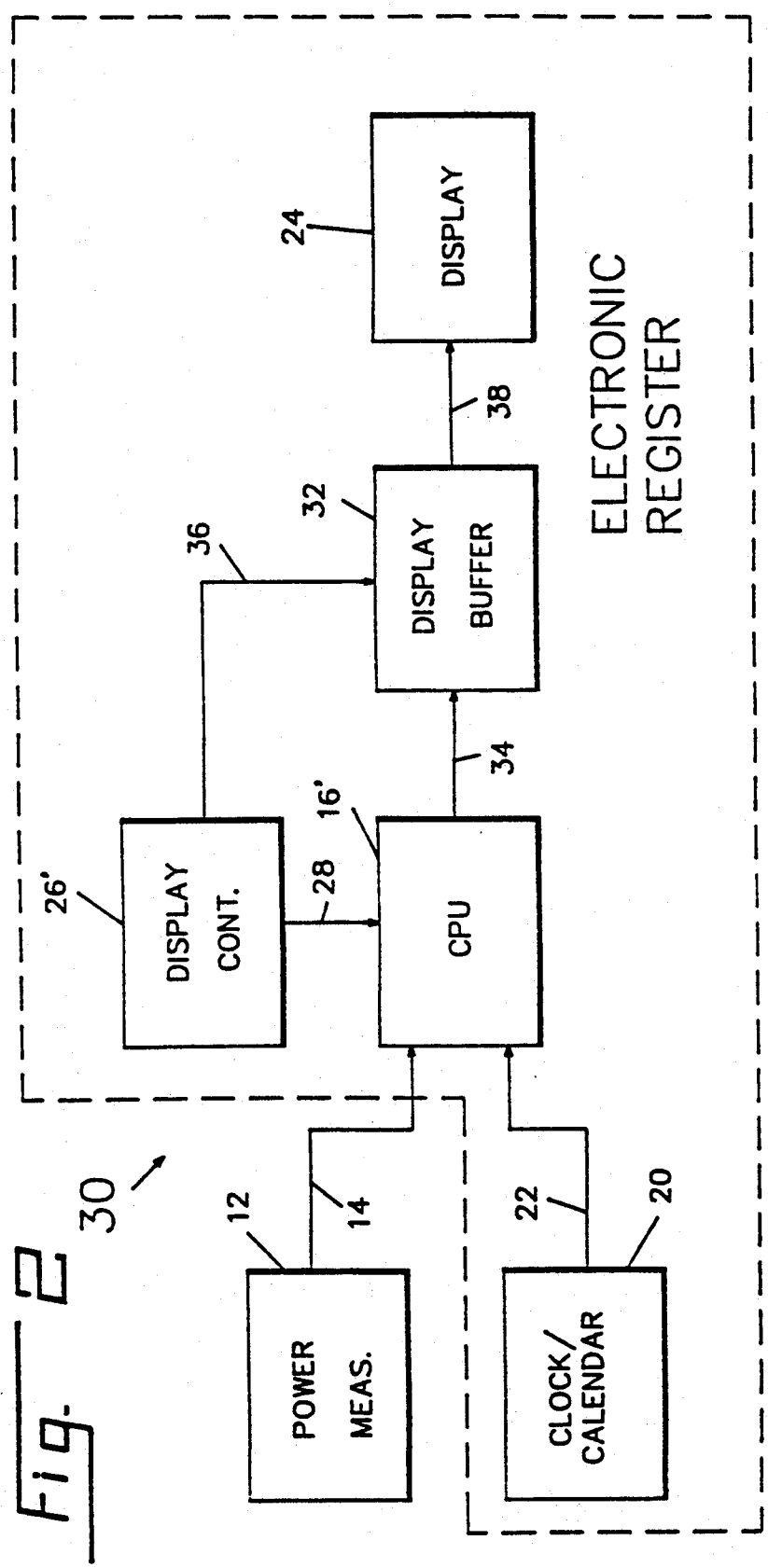

FREEZING ITEMS FOR DISPLAY IN ELECTRONIC WATTHOUR REGISTER

This application is a continuation of application Ser. No. 07/512,799, filed Apr. 27, 1990, now abandoned, which is a continuation of application Ser. No. 07/022,145, filed Mar. 5, 1987, now abandoned.

BACKGROUND OF THE INVENTION

The present invention relates to electric watthour metering systems and, more particularly, to watthour metering systems including an electronic register containing a plurality of items to be displayed.

Electric watthour metering systems conventionally employ means for measuring instantaneous power consumption by a load and means for accumulating the instantaneous power consumption to provide a measurement of electric energy consumed by the load.

The most familiar type of power-measurement device includes a metallic disk driven at a speed proportional to the product of the line voltage and the load current, that is, the power consumed by the load. Each revolution of the metallic disk signifies the consumption of a predetermined quantum of electric energy. In some equipment, a pulse initiator converts the revolutions of the disk into electrical output pulses, each signifying the consumption of a predetermined quantum of electric energy.

More recently, fully electronic power-measurement devices are disclosed which directly measure consumption of electric power without the intermediate step of rotating a disk. These electronic devices produce an output pulse upon sensing the consumption of a predetermined quantum of electric energy.

In either type of power-measurement equipment, an electronic register conventionally sums the pulses to produce a total of energy consumption.

Utilities generally consider that the cost of electric energy can be attributed to two factors: 1) the out-of-pocket cost for generating the energy (fuel, operating and maintenance personnel and equipment, etc.) and 2) the capital cost of the generating equipment which must be installed to generate the electric energy.

Electric energy consumption is far from constant over a day, month or year. In some seasons such as, for example, the air-conditioning season, power demand is much greater than at other seasons. In order to provide adequate service, the utility must provide generating equipment capable of satisfying the maximum demand which it may experience. Thus, the utility must bear the capital cost of installing sufficient generating capacity to satisfy the peak demand. It must do this while knowing that, except at peak times, a substantial portion of its generating capacity remains idle. According to this analysis, the capital component of the total energy cost is governed by the peak demand in the peak season.

Some rate-setting bodies have recognized the importance of peak demand and have established tariffs in a manner designed to encourage energy consumers to limit peaks in their energy usage and to shift energy consumption from peak to off-peak times. One of such tariffs permits the utility to measure the amount of energy consumed in a sequence of demand intervals. At the end of each demand interval, the demand in the just-completed demand interval is compared with a stored value representing the highest demand in any demand interval since the register was last reset. If the demand in the just-completed demand interval is higher than the previous high demand value, then the value of the demand in the just-completed demand interval is stored and the previously-stored value is deleted. The value of the maximum demand existing at the time the meter is read determines the rate the consumer must pay for all of its electric energy. Thus, the consumer receives a powerful economic incentive to limit the peak load placed on the utility system.

An electronic register including demand metering and time-of-use metering require constantly updated time and date information for setting the lengths of the demand intervals and for switching between the permitted rates at different times and seasons.

The data in an electronic register is displayed on a human-readable display device for providing access to the data stored therein. Conventional display devices include, for example, light-emitting diodes and liquid-crystal displays. In order to limit cost, and to conserve space, such display devices are capable of displaying far less than the total amount of information contained in the electronic register. It is thus conventional to display the data sequentially, one or two lines at a time, holding each displayed line on the display for long enough for a person to see, and possibly to write down, the relevant information. Each item may remain displayed for several seconds. In some operations for electronic registers, a large number of separate items require sequential occupancy on the display wherein each occupancy requires several seconds to complete. The complete display sequence, sometimes called a scroll, may take up to several minutes.

The extended time for running a complete display scroll produces a problem in interpreting the data. In conventional systems, each displayed item represents the value of the displayed data at the time that it is displayed. In a scroll lasting for several minutes, the later-displayed data may not relate to the earlier-displayed data. For example, during the scroll, the electronic register may have passed from one demand interval to another, and may have recorded a new maximum demand, and have zeroed the data in the current-demand period. One examining the scrolled display may find it difficult to understand the relationship between present, very small, amount of energy accumulated in the current-demand period and the previously-displayed data of the timing of the demand interval itself which showed that the end of the demand interval was being approached. As a further example, during the scroll, the time of day may have passed from one time-of-use accumulation to another. Combining earlier- and later-displayed data of this type may be misleading.

OBJECTS AND SUMMARY OF THE INVENTION

Accordingly, it an object of the invention to provide an electronic register for electric watthour metering system which overcomes the drawbacks of the prior art.

It is a further object of the invention to provide an electronic register for an electric watthour metering system wherein all elements in scrolled display data relate to each other.

It is a further object of the invention to provide an electronic register for an electric watthour metering system including a display buffer into which all data to be displayed is stored, and from which, desired items of data are scrolled for display. The display buffer ensures that all displayed items in a display scroll relate to the same time and to consistent conditions of the data in the electronic register.

Briefly stated, the present invention provides an electronic register for an electric watthour metering system. The electronic register includes a display buffer for receiving, at substantially the same time, all data items to be displayed. The data items in the display buffer are scrolled to a display in sets appropriate for the capacity of the display. Each set is maintained on the display for as long as required for human reading. The displayed items, having been taken into the display buffer at the same instant, are consistent with each other regardless of the length of time required to complete the display sequence.

According to an embodiment of the invention, there is provided an electronic register for a electric watthour metering system, the electric watthour metering system including a power measurement device effective for producing signals each signifying consumption of a predetermined quantum of electricity by a load, comprising: a central processing unit effective for accumulating the signals, a display for displaying data in the central processing unit, a display buffer, means for transferring all data to be displayed to the display buffer at substantially the same instant, and means for displaying data in the display buffer without the display reflecting changes in data in the central processing unit.

According to a feature of the invention, there is provided a method for displaying data in an electronic register for a electric watthour metering system, the electric watthour metering system including a power measurement device effective for producing signals each signifying consumption of a predetermined quantum of electricity by a load, comprising: accumulating the signals in a central processing unit, transferring all data to be displayed to a display buffer at substantially the same instant, and displaying data in the display buffer without the display reflecting changes in data in the central processing unit.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a simplified block diagram of an electric watthour metering system according to the prior art.

FIG. 2 is a simplified block diagram of an electric watthour metering system according to an embodiment of the invention.

DETAILED DESCRIPTION OF THE PREFERRED EMBODIMENT

Referring to FIG. 1, there is shown, generally at 10, an electric watthour metering system according to the teaching of the prior art. A power- measurement device 12 which may be, for example, an electro-mechanical or an all-electronic device, produces signals, each signifying the consumption of a predetermined quantum of electric energy, for application on a line 14 to a central processing unit 16 of an electronic register 18. A clock/calendar circuit 20 applies signals indicating the current date and time of day on a line 22 to central processing unit 16.

A display 24 produces human-readable indicia indicating the present contents of data registers in central processing unit 16. Such contents may include, for example, the date, time of day, the current demand interval, the amount of energy accumulated in the current demand interval, the maximum demand experienced in any demand interval since the register was last reset, the time-of-use rate currently being applied. In addition to the preceding, various test and troubleshooting functions may expand the data to be displayed, and the consequent time to accomplish the display, by an order of magnitude.

A display controller 26 applies control signals on a line 28 to central processing unit 16 for controlling the data to be displayed and the manner in which the display is to be accomplished. It is conventional for display controller 26 to provide a normal-operation mode in which a small number of the data items of interest to the energy consumer are displayed, either constantly, or in a scroll of relatively brief length. Display controller 26 may also be capable of receiving manual or electronic commands for changing the amount and type of data displayed. For example, an externally actuatable switch (not shown) such as disclosed, for example, in U.S. Pat No. 4,602,211, may be provided. The switch may be actuated from the normal position to a reading position by a meter reader to enable display of the data of interest to the meter reader. The switch may also include means for resetting a demand register upon completion of reading. The switch may also have a test position accessible to a service technician for providing display of more detailed data of interest to the service technician in verifying correct performance of electronic register 18, or in isolating a fault to a replaceable unit.

Display modes other than the normal display can contain enough items for sequential display that a relationship between earlier- and later-displayed items is lost.

Referring now to FIG. 2, there is shown, generally at 30 electric watthour metering system, a electric watthour metering system according to an embodiment of the invention. Elements having identical reference numerals to those in FIG. 1 are identical in structure and function in the embodiment in FIG. 2. Elements in FIG. 2 which have substantially similar functions to those described in connection with FIG. 1 are primed. A full discussion of the identical items is properly omitted herefrom.

A display buffer 32 is interposed between central processing unit 16' and display 24. One output of display controller 26' on line 28 enables output of all items to be displayed from central processing unit 16' on a line 34 to display buffer 32. The transfer of data to be displayed into display buffer 32 is so fast as to be substantially instantaneous. Thus, the data in display buffer 32 represents a snapshot at a single time of the data in central processing unit 16'. Display controller 2' applies a display-scrolling command signal on a line 36 to display buffer 32. Display buffer 32 then outputs the sequence of data items on a line 38 to display 24 in a sequence, and for times required for human use of the data.

The data items displayed on display 24 are all from the instant that the full set of data was transferred into display buffer 32. While the display is proceeding, the contents of central processing unit 16' are proceeding in their normal functions wherein some of the data items are changed. Such changes do not provide inconsistencies to the one observing the display.

Any convenient devices may be employed for realizing the invention in FIG. 2. As previously noted, power measurement device 12 may be electronic or electromechanical. Central processing unit 16' is preferably a digital device and, most preferably, a microprocessor. Display buffer 32 may be an area of random-access memory or may be an storage element such, for example, an electronically eraseable read only memory. Clock/calendar circuit 20 may be a conventional integrated circuit, preferably including a battery backup for providing continued operation during a power outage.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What I claim is:

1. An apparatus for a metering system, the metering system including power measurement means for producing electrical signals indicative of consumption of a quantum of electricity, said apparatus comprising:
   (a) processing means for deriving a plurality of data items from signals produced by the power measurement means;
   (b) display means for displaying the data items as a plurality of data sets, said display means being operable to sequentially display each data set so that each data set is displayed and visible to a human observer one at a time;
   (c) display buffer means;
   (d) first means for transferring, substantially simultaneously, the plurality of data items which compose all of the data sets to be displayed as part of a single sequence from said processing means to said display buffer means; and
   (e) second means for transferring said plurality of data items from said display buffer means to said display means, said display buffer means providing that the data items transferred thereto are unchanged in said display buffer means during the sequential display of the plurality of data sets.

2. An apparatus in accordance with claim 1 wherein said processing means comprises a microprocessor.

3. An apparatus in accordance with claim 1 wherein the data sets displayed include at least one data set from a group of data sets comprising date, time of day, current demand interval, amount of energy accumulated in the current demand interval, maximum demand experienced in any demand interval since last reset, current time-of-use rate, test and troubleshooting data sets.

4. An apparatus in accordance with claim 1, further comprising clock/calendar means for maintaining said processing means updated with current time and date, the time and date being transferable as time and date data items to said display buffer means.

5. An apparatus in accordance with claim 4 wherein said second means for transferring further comprises means for transferring the time and date data items from said display buffer means to said display means for display thereon as indicia indicating a time and date when the data items representative of the consumption quantity were transferred to said display buffer.

6. A method for displaying data from a processing means which composes part of a metering system, the metering system further including a power measurement means for producing electrical signals indicative of consumption of a quantum of electricity, said method comprising the steps of:
   (a) accumulating the signals produced by the power measurement means and deriving from the signals at least one consumption quantity, the consumption quantity being represented as a plurality of data items;
   (b) transferring, substantially simultaneously, the plurality of data items which compose all of the data sets to be displayed as part of a single sequence from the processing means to a display buffer means; and
   (c) displaying the data items transferred to the display buffer means, the data items being sequentially displayed as a plurality of data sets so that each data set is displayed and visible to a human observer one at a time, the display buffer means providing that the data items transferred thereto are unchanged in the display buffer means during the sequential display of the plurality of data sets.

7. A method in accordance with claim 6, further including the step of maintaining, in the processing means, time and date information to be provided to the display buffer means as a plurality of data items representative of the time and date, the time and date data items being transferable to the display buffer means for display as indicia indicating a date and a time when the data items representative of the consumption quantity were transferred to the display buffer means.

8. A method in accordance with claim 6, wherein the step of accumulating comprises the steps of continuing to accumulate the signals produced by the power measurement means and updating the data items representative of the consumption quantity while sequentially displaying the data items transferred to the display buffer means in the step of transferring.

9. A method in accordance with claim 6 wherein the data sets displayed include at least one data set from a group of data sets comprising date, time of day, current demand interval, amount of energy accumulated in the current demand interval, maximum demand experienced in any demand interval since last reset, current time-of-use rate, test and troubleshooting data sets.

* * * * *